United States Patent [19]

Senkalski et al.

[11] Patent Number: 4,961,998

[45] Date of Patent: Oct. 9, 1990

[54] DIELECTRIC COMPOSITION HAVING CONTROLLED THERMAL EXPANSION

[75] Inventors: Robert E. Senkalski; Donald L. Hasenmayer, both of North Wales, Pa.

[73] Assignee: National Starch and Chemical Investment Holding Corporation, Wilmington, Del.

[21] Appl. No.: 309,517

[22] Filed: Feb. 10, 1989

Related U.S. Application Data

[63] Continuation-in-part of Ser. No. 248,766, Sep. 23, 1988, abandoned.

[51] Int. Cl.$^5$ .............................................. B32B 9/00
[52] U.S. Cl. ............................... 428/426; 428/432; 428/446; 428/688; 428/901; 501/15; 501/17; 501/20; 501/22; 501/61; 501/62; 501/73; 501/76

[58] Field of Search ...................... 501/15, 17, 20, 22, 501/61, 62, 73, 76; 428/426, 432, 446, 688, 901

[56] References Cited

U.S. PATENT DOCUMENTS

| | | | |
|---|---|---|---|
| 4,645,552 | 2/1987 | Vitriol et al. ......................... | 156/89 |
| 4,649,125 | 3/1987 | Takeuchi et al. ..................... | 501/15 |
| 4,654,095 | 3/1987 | Steinberg .............................. | 156/89 |
| 4,777,092 | 10/1988 | Kawakami et al. ................. | 428/428 |

Primary Examiner—Patrick Ryan

[57] ABSTRACT

Dielectric ink, paste and tape compositions having controlled thermal expansion contain a mixture of glasses wherein at least one glass has a coefficient of thermal expansion (CTE) below the CTE of the substrate to which the dielectric composition is applied and at least one glass has a CTE above the CTE of said substrate. The dielectric compositions significantly reduce or eliminate warpage of the substrate.

20 Claims, No Drawings

DIELECTRIC COMPOSITION HAVING CONTROLLED THERMAL EXPANSION

This application is continuation-in-part of application Ser. No. 248,766 filed Sept. 23, 1988 abandoned.

BACKGROUND OF THE INVENTION

Multilayer thick film circuits are typically fabricated by screen printing layers or patterns of dielectric and conductive materials onto a ceramic substrate and firing at elevated temperature to fuse the dielectric and conductive materials to the substrate. In most cases it is necessary to sequentially print, fire and cool each layer before the next layer can be applied. The firing process can involve temperatures as high as 1000° C. which can lead to severe warpage of the substrate during the subsequent cooling stage.

U.S. Pat. No. 4,655,864 discloses a dielectric composition comprising a dispersion of finely divided solids comprising: (a) 40-70% volume noncrystallizable glass, (b) 60-30% vol. of a mixture of refractory oxides, (c) polymeric binder and (d) volatile organic solvent. The glass disclosed in the '864 patent is a single glass having a softening point of at least 500° C. and a viscosity of $1 \times 10^6$ poises or less at 825°-1025° C. The mixture of refractory oxides consists of $Al_2O_3$ as the primary refractory and a secondary refractory such as quartz, $CaZrO_3$ or fused silica.

U.S. Pat. No. 4,654,095 discloses a dielectric composition comprising an admixture of finely divided solids comprising:

(a) 50-17% wt. noncrystallizable glass having a deformation temp ($T_d$) of 580°-625° C., a softening point ($T_s$) of 630°-700° C., and ($T_s - T_d$) is 50°-75° C., and;

(b) 50-25% wt. refractory which is substantially insoluble in the glass at 825°-900° C.

The present invention is an improvement over the prior art dielectric compositions in that this invention utilizes a blend or admixture of glasses to tailor the CTE of the glass blend to match that of the substrate. This gives great flexibility in preparing glass blends having a wide range of CTE values and results in significantly reduced warpage of the substrate.

SUMMARY OF THE INVENTION

This invention relates to dielectric ink, paste and tape compositions which contain a mixture of glasses wherein (i) at least one glass has a coefficient of thermal expansion (CTE) below the CTE of the substrate to which the dielectric composition is applied and (ii) at least one glass has a CTE above the CTE of said substrate. The dielectric compositions of this invention significantly reduce or eliminate warpage of the substrate caused by the firing process. The dielectric composition is especially useful on an alumina substrate and comprises about 25-60% by weight of said glass mixture, about 20-65% by weight of a refractory filler and about 10-30% by weight of an organic binder based on the total weight of said dielectric composition. Glass (i) and glass (ii) are blended at a weight ratio of 10:90 to 90:10 in such a manner that the weight average CTE of the blended glasses is equal to or approximately equal to the CTE of the substrate.

DETAILED DESCRIPTION

The present invention relates to dielectric compositions, suitable for casting on a ceramic substrate, comprising in combination, (a) about 20-65% by weight of a refractory filler, (b) about 10-30% by weight of an organic binder and (c) about 25-60% by weight of a mixture of (i) at least one glass having a coefficient of thermal expansion (CTE) less than the coefficient of thermal expansion of said substrate and (ii) at least one glass having a coefficient of thermal expansion greater than the coefficient of thermal expansion of said substrate. The dielectric compositions of this invention are useful in an improved process for fabricating electronic circuit boards and other electronic components. The novel dielectric compositions result in a significantly reduced warpage of the substrate and a more uniform firing of the dielectric. The glass mixture of this invention has a great advantage over the single glass used in prior art dielectric compositions in that the present composition can be prepared having a wide range of CTE values.

It is critical to the practice of this invention that the dielectric composition comprise about 25-60% by weight (most preferably about 39-47%) of a mixture of glass (i) and glass (ii). The suitable weight ratio of glass (i) to glass (ii) ranges from about 10:90 to about 90:10, preferably 25:75 to 75:25. The specific ratio of glass (i) to glass (ii) is determined such that the weight average CTE of the glass mixture is equal to or approximately equal to the CTE of the ceramic substrate. The weight average CTE of the glass mixture can be calculated using the following formula:

wt. avg. CTE=[wt. % glass (i) times CTE of glass (i)]+[wt. % glass (ii) times CTE of glass (ii)]

Glass (i) preferably has a CTE of about $6.77 \times 10^{-6}/°C$. over the temperature range of 25°-250° C. Glass (ii) preferably has a CTE of about $8.0 \times 10^{-6}/°C$. over the temperature range of 25°-250° C. Preferably, the difference between the CTE of glass (i) and the CTE of glass (ii) does not exceed $2.5 \times 10^{-6}/°C$.

The glasses suitable for use in this invention can be of any composition. The glasses preferably have a softening point greater than about 400° C. The glasses preferably are borosilicate glasses. A preferred composition for glass (i) comprises by weight about 22.8% $SiO_2$, 29.5% $B_2O_3$, 38.3% $BaCO_3$ and 7.9% ZnO and 1.5% $Co_2O_3$. Another preferred composition for glass (i) comprises by weight 100 parts Si, 73.9 parts Ca, 62.8 parts Zn, 17.4 parts Al, 10.1 parts Ti, 7.3 parts K, 14.0 parts Zr, 6.6 parts Pb, 6.0 parts Mn, 3.7 parts Sn, 3.1 parts P and 2.4 parts Rb. A preferred composition for glass (ii) comprises by weight about 15.0% $SiO_2$, 26.7% $B_2O_3$, 3.0% $Al_2O_3$, 50.2% BaO, 2.1% $Bi_2O_3$ and 2.0% $TiO_2$. Another preferred composition for glass (ii) comprises by weight about 52.3% $SiO_2$, 15.4% $B_2O_3$, 4.1% $Al_2O_3$, 4.3% $Na_2O$, 5.4% CaO, 17.3% SrO and 1.2% $ZrO_2$.

The refractory filler useful in the practice of this invention can be any of those typically used in making dielectric compositions. Suitable fillers include alpha-quartz, $Al_2O_3$, $CaZrO_3$, forsterite, mullite, cordierite, zirconia and mixtures thereof. The preferred filler is $Al_2O_3$. The preferred amount of filler used in the dielectric composition is about 22-65% by weight, most preferably about 55%.

The dielectric compositions of this invention comprise about 10-30% by weight of an organic binder, preferably about 13-27%, most preferably 15-24%. Suitable organic binders include, for example poly(vinyl butyral), poly(vinyl acetate), poly(vinyl alcohol), cellulosic polymers such as methyl cellulose, ethyl cellulose, hydroxyethyl cellulose, methylhydroxyethyl cellulose, polypropylene, polyethylene, silicon polymers such as poly(methyl siloxane), poly(methylphenyl siloxane), polystyrene, butadiene/styrene copolymer, polystyrene, poly(vinyl pyrollidone), polyamides, high molecular weight polyethers, copolymers of ethylene oxide and propylene oxide, polyacrylamides, and various acrylic polymers such as sodium polyacrylate, poly(lower alkyl acrylates), poly(lower alkyl methacrylates) and various copolymers and acrylates), poly(lower alkyl methacrylates) and various copolymers and multipolymers of lower alkyl acrylates and methacrylates.

The organic binder is preferably dissolved in an organic solvent which can comprise from about 80-90% by weight of the organic binder component. Suitable organic solvents include for example, acetone, xylene, methanol, ethanol, isopropanol, methyl ethyl ketone, 1,1,1-trichloroethane, tetrachloroethylene, diethylene glycol monobutyl ether acetate, diethylene glycol monobutyl ether, amyl acetate, 2,2,4-triethyl pentanediol-1,3-monoisobutyrate, toluene, terpineol, methylene chloride and fluorocarbons. The most preferred organic solvent is diethylene glycol monobutyl ether, terpineol or mixtures thereof.

The dielectric compositions of this invention can be prepared by mixing the glasses with the filler and ball milling. This mixture can subsequently be mixed with the organic binder (which typically is dissolved in organic solvent).

The compositions of this invention can be used in the form of dielectric inks, pastes or dielectric tapes depending upon the particular processing and application. The paste compositions of this invention have a viscosity of about 100,000-400,000 centipoise and can be diluted with suitable organic solvent as described earlier to form a flowable dielectric dispersion ink which is suitable for screen printing. In fabricating electrical circuit boards and other multilayer structures, the dielectric paste composition is cast on a rigid ceramic substrate and fired at a temperature of about 800° C. to about 1000° C. for a sufficient time to volatilize or burn-out all the organic material and to sinter the glasses and other inorganic materials. The preferred firing temperature for the paste compositions is about 850° C.

The dielectric tape composition of this invention is a pyrolizable layer of dielectric composition cast on polymeric film or sheets (referred to in the art as "green tape") which are applied to substrates following a process such as described in U.S. Pat. No. 4,645,552, which is herein incorporated by reference.

The dielectric compositions of this invention are suitable for use on a variety of ceramic substrates, such as, for example alumina, aluminum nitride, silicon carbide, beryllia and the like. The most preferred substrate is 96% by weight alumina which preferably has a CTE of about $7.5 \times 10^{-6}$ to about $7.9 \times 10^{-6}$ per °C. over a temperature of about 25°-900° C.

The following Examples are presented to demonstrate this invention. The examples are intended to be illustrative and not limitative. All parts and percentages are on a weight basis unless otherwise indicated.

EXAMPLE I

Dielectric paste compositions falling within the scope of this invention were prepared by mixing glass blends with $Al_2O_3$ filler and ball milling for four hours to give a well-mixed and homogenous powder. This powder was then blended with binder. The binder component comprised by weight 3.8% ethyl hydroxy ethyl cellulose, 9.2% ethyl cellulose, 43% 2,2,4-trimethyl-1,3-pentanediol monoisobutyrate, and 44% diethylene glycol monobutyl ether acetate. The compositions were thoroughly mixed on a 3-roll mill to form the dielectric compositions of this invention. All of these compositions had a formulation of 43% glass, 27% filler and 30% organic binder. The glass blends were a mixture of glass (i) and glass (ii) having the composition given below:

| (glass i) | (glass ii) |
| --- | --- |
| 22.8% $SiO_2$ | 15.0% $SiO_2$ |
| 29.5% $B_2O_3$ | 26.7% $B_2O_3$ |
| 38.3% BaO | 3.0% $Al_2O_3$ |
| 7.9% ZnO | 50.2% BaO |
| 1.5% $Co_2O_3$ | 2.1% $Bi_2O_3$ |
| 3.0% $TiO_2$ | |

The specific glass blends used in the dielectric compositions are given in Table I below.

TABLE I

| Sample | Glass Blend (parts by wt.) | | Calculated CTE of glass blend |
| --- | --- | --- | --- |
| | (Glass i) | (Glass ii) | |
| A | 75 | 25 | $7.078 \times 10^{-6}$/°C. |
| B | 50 | 50 | $7.385 \times 10^{-6}$/°C. |
| C | 25 | 75 | $7.693 \times 10^{-6}$/°C. |

EXAMPLE II

Following the procedures of Example I above, dielectric compositions falling outside the scope of this invention were prepared for comparative purposes. Sample D contained 43% of the single glass (i) as described in Example I. Sample E contained 43% of the single glass (ii) as described in Example I. The specific glass component is given in Table II below.

TABLE II

| Sample | Glass Blend (parts by wt.) | | CTE* of glass blend |
| --- | --- | --- | --- |
| | (Glass i) | (Glass ii) | |
| D | 100 | 0 | $6.77 \times 10^{-6}$/°C. |
| E | 0 | 100 | $8.00 \times 10^{-6}$/°C. |

*CTE values are measured and reported by glass manufacturer.

EXAMPLE III

The dielectric compositions prepared in Example I and Example II above were screen printed on 96% alumina substrates having dimensions of $1 \times 2 \times 0.025$ inches. Each substrate was repeatedly screen printed, dried, and fired at 850° C. to give a final dielectric thickness of 10 mils. The warpage of the substrates was then measured and rated as follows:

excessive warpage—greater than 15 mils/inch
slight warpage—2-15 mils/inch
minimal warpage—<2 mils/inch The warpage results are presented in Table III below.

TABLE III

| Sample | Warpage Rating |
|---|---|
| A | slight warpage |
| B | minimal warpage |
| C (comparative) | slight warpage |
| D (comparative) | excessive warpage |
| E (comparative) | excessive warpage |

EXAMPLE IV

Following the procedures of Example I and Example II dielectric compositions were prepared having glass contents as shown in Table IV. These dielectric compositions were evaluated for warpage as described in Example III and the results are presented in Table IV.

The glasses utilized in this example had the following compositions:

| (Glass i) | (Glass ii) | |
|---|---|---|
| 100 parts Si | 52.3% | $SiO_2$ |
| 73.9 parts Ca | 15.4% | $B_2O_3$ |
| 62.8 parts Zn | 4.1% | $Al_2O_3$ |
| 17.4 parts Al | 4.3% | $Na_2O$ |
| 10.1 parts Ti | 5.4% | CaO |
| 7.3 parts K | 17.3% | SrO |
| 14.0 parts Zr | 1.2% | $ZrO_2$ |
| 6.6 part Pb | | |
| 6.0 parts Mn | | |
| 3.7 parts Sn | | |
| 3.1 parts P | | |
| 2.4 parts Rb | | |
| 35.3 parts Fe | | |

TABLE IV

| Sample | Glass (parts by wt.) (Glass i) | (Glass ii) | CTE of Glass | Warpage Rating |
|---|---|---|---|---|
| F | 25 | 75 | $7.725 \times 10^{-6}/°C$ | slight warpage |
| G | 50 | 50 | $7.65 \times 10^{-6}/°C$ | minimal warpage |
| H | 75 | 25 | $7.575 \times 10^{-6}/°C$ | slight warpage |
| I (comparative) | 100 | 0 | $7.50 \times 10^{-6}/°C$ | excessive warpage |
| J (comparative) | 0 | 100 | $7.80 \times 10^{-6}/°C$ | excessive warpage |

EXAMPLE V

Following the procedures of Example I a dielectric composition falling within the scope of this invention was prepared comprising a glass blend containing 10 parts by wt. glass (i) and 90 parts by wt. glass (ii) as described in Example I. The composition was evaluated for warpage as in Example III and the warpage was less than 2 mils/inch.

EXAMPLE VI

A dielectric tape composition falling within the scope of this invention was prepared by mixing a glass blend with $Al_2O_3$ filler and organic binder and ball milling for 24 hours to give a well-dispersed and homogenous slip composition. This slip composition was then cast onto polyester sheets (Mylar ® available from DuPont Co.) and dried to give a film thickness of about 4 mils. The binder component comprised by weight 56.4% acrylic polymer, 39.0% butyl benzyl phthalate plasticizer and 4.6% sorbitan oleate/silane dispersant. The slip composition had a formulation of 39.3% glass mixture, 45.2% refractory filler and 15.5% organic binder. The glass blend was a mixture of glass (i) and glass (ii) as described in Example I in a weight ratio of glass (i) to glass (ii) of 9:1.

The dried dielectric tape prepared above was then cut, via-punched, and laminated to a 96% alumina substrate (0.5×4.0×0.025 inches) in a hydraulic press at 500–2000 lbs./square inch and about 70° C. for about 3 minutes. After removing the Mylar ® polyester sheet, the laminated substrate was fired using a standard thick film furnace profile with a residence time of approximately 60 minutes and a peak temperature of 850°–910° C. for 10 minutes. The warpage was measured as in Example III and was less than 2 mils/inch.

We claim:

1. A dielectric composition, suitable for casting or laminating onto a ceramic substrate, comprising in combination (a) about 20–65% by weight of a refractory filler, (b) about 10–30% by weight of an organic binder and (c) about 25–60% by weight of a mixture of (i) at least one non-crystalline glass having a coefficient of thermal expansion less than the coefficient of thermal expansion of said substrate and (ii) at least one non-crystalline glass having a coefficient of thermal expansion greater than the coefficient of thermal expansion of said substrate.

2. A composition of claim 1 wherein said substrate is selected from the group consisting of alumina, aluminum nitride, beryllia and silicon carbide.

3. A composition of claim 2 wherein said substrate comprises 96% by weight alumina.

4. A composition of claim 3 wherein said substrate has a coefficient of thermal expansion from about $7.5 \times 10^{-6}/°C$. to about $7.9 \times 10^{-6}/°C$. over a temperature of about 25°–900° C.

5. A composition of claim 1 wherein the weight ratio of said glass (i) to said glass (ii) ranges from about 10:90 to about 90:10.

6. A composition of claim 1 wherein the weight ratio of said glass (i) to said glass (ii) ranges from about 25:75 to about 75:25.

7. A composition of claim 1 wherein said glass is a borosilicate glass.

8. A composition of claim 3 wherein said glass (i) has a coefficient of thermal expansion of about $6.77 \times 10^{-6}$ per °C. over a temperature range of about 25°–250° C. and said glass (ii) has a coefficient of thermal expansion of about $8.0 \times 10^{-6}$ per °C. over a temperature range of about 25°–250° C.

9. A composition of claim 3 wherein said glass (i) comprises by weight about 22.8% $SiO_2$, 29.5% $B_2O_3$, 1.5% $Co_2O_3$ 38.3% BaO and 7.9% ZnO.

10. A composition of claim 3 wherein said glass (i) comprises by weight 100 parts Si, 73.9 parts Ca, 62.8 parts Zn, 17.4 parts Al, 10.1 parts Ti, 7.3 parts K, 14.0 parts Zr, 6.6 parts Pb, 6.0 parts Mn, 3.7 parts Sn, 3.1 parts P and 2.4 parts Rb.

11. A composition of claim 3 wherein said glass (ii) comprises by weight about 52.3% $SiO_2$, 15.4% $B_2O_3$, 4.1% $Al_2O_3$, 4.3% $Na_2O$, 5.4% CaO, 17.3% SrO and 1.2% $ZrO_2$.

12. A composition of claim 3 wherein said glass (ii) comprises by weight about 15.0% $SiO_2$, 26.7% $B_2O_3$, 3.0% $Al_2O_3$, 50.2% BaO, 2.1% $Bi_2O_3$ and 3.0% $TiO_2$.

13. In a process for fabricating an electronic circuit board, the improvement comprising applying a layer of the composition of claim 1 onto a rigid ceramic substrate and firing said substrate at a temperature of about 800° C. to about 1000° C.

14. A ceramic substrate containing cast thereon a composition of claim 1.

15. A composition of claim 1 wherein said composition is a paste having a viscosity of about 100,000 to about 400,000 centipoise.

16. A composition of claim 15 wherein said composition has been further diluted with an organic solvent to a flowable dispersion.

17. A composition of claim 1 wherein said composition is a solid film.

18. A composition of claim 17 wherein said composition has been applied onto a polymeric film.

19. A composition of claim 18 wherein said polymeric film is polyester.

20. A composition of claim 17 comprising by weight about 39.3% of said glass mixture about 45.2% of said refractory filler and about 15.5% of said organic binder.

* * * * *